(12) United States Patent
Hung et al.

(10) Patent No.: US 7,471,562 B2
(45) Date of Patent: Dec. 30, 2008

(54) METHOD AND APPARATUS FOR ACCESSING NONVOLATILE MEMORY WITH READ ERROR BY CHANGING READ REFERENCE

(75) Inventors: Chun-Hsiung Hung, Hsinchu (TW); Han-Sung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 53 days.

(21) Appl. No.: 11/735,911

(22) Filed: Apr. 16, 2007

(65) Prior Publication Data

US 2007/0258297 A1 Nov. 8, 2007

Related U.S. Application Data

(60) Provisional application No. 60/746,733, filed on May 8, 2006.

(51) Int. Cl.
*G11C 11/34* (2006.01)
(52) U.S. Cl. .............................. 365/185.09; 365/185.2; 365/189.09
(58) Field of Classification Search ............ 365/185.09, 365/185.2, 189.09
See application file for complete search history.

(56) References Cited

U.S. PATENT DOCUMENTS

| | | | |
|---|---|---|---|
| 5,432,802 A | 7/1995 | Tsuboi et al. | |
| 5,467,357 A | 11/1995 | Asami et al. | |
| 5,603,001 A | 2/1997 | Sukegawa et al. | |
| 5,732,092 A | 3/1998 | Shinohara et al. | |
| 5,754,567 A | 5/1998 | Norman | |
| 5,765,185 A | 6/1998 | Lambrache et al. | |
| 5,956,743 A | 9/1999 | Bruce et al. | |
| 6,041,001 A | 3/2000 | Estakhri | |
| 6,272,659 B1 | 8/2001 | Zook | |
| 6,639,849 B2 | 10/2003 | Takahashi et al. | |
| 6,651,212 B1 | 11/2003 | Katayama et al. | |
| 6,683,817 B2 | 1/2004 | Wei et al. | |
| 6,799,256 B2 | 9/2004 | Van Buskirk et al. | |
| 6,839,875 B2 | 1/2005 | Roohparvar | |
| 6,992,932 B2 | 1/2006 | Cohen et al. | |
| 7,225,390 B2 | 5/2007 | Ito et al. | |
| 7,392,457 B2 * | 6/2008 | Tamura et al. ............ 714/763 |
| 2004/0153902 A1 | 8/2004 | Machado et al. | |
| 2005/0122790 A1 * | 6/2005 | Ueno et al. ............ 365/189.05 |
| 2005/0172065 A1 | 8/2005 | Keays | |
| 2006/0026489 A1 | 2/2006 | Noda et al. | |
| 2006/0036897 A1 | 2/2006 | Lin et al. | |
| 2006/0104115 A1 | 5/2006 | Chun et al. | |
| 2006/0221696 A1 * | 10/2006 | Li ...................... 365/185.12 |

\* cited by examiner

*Primary Examiner*—Tuan T. Nguyen
(74) *Attorney, Agent, or Firm*—Kanta Suzue; Haynes Beffel & Wolfeld LLP

(57) ABSTRACT

The read reference of a nonvolatile memory integrated circuit is changed in response to a disagreement between a previously generated check code associated with previously programmed data bits and a more recently generated check code generated in response to a read command.

25 Claims, 6 Drawing Sheets

METHOD AND APPARATUS FOR ACCESSING NONVOLATILE MEMORY WITH READ ERROR BY CHANGING READ REFERENCE

REFERENCE TO RELATED APPLICATION

This application claims the benefit of U.S. Provisional Patent Application No. 60/746,733, filed 8 May 2006 by inventors Chun-Hsiung Hung and Han Sung Chen entitled Moving Reference Current Sensing Algorithm With ECC Scheme.

BACKGROUND OF THE INVENTION

1. Field of the Invention

The invention relates to nonvolatile memory integrated circuits generally, and more particularly to error detection and error correction of data that are read from nonvolatile memory.

2. Description of Related Art

The purpose of nonvolatile memory is to store data reliably, such that power loss does not affect the integrity of the stored data. To allow for unforeseen charge gain or charge loss that might affect a threshold voltage of a nonvolatile memory cell, a margin separates threshold voltage ranges that represent different logical levels. However, despite this margin, errors nevertheless occur, such that a data bit programmed as a high logical level will be read as a low logical level, or vice versa.

Although error correction and error detection algorithms will address some of these errors, error correction and error detection algorithms are only designed to handle a limited number of incorrect bits. After this limit is exceeded, error correction and error detection algorithms are insufficient. Moreover, error detection will detect, but not correct, such errors.

Therefore, a need exists for an improvement that makes nonvolatile memory integrated circuits more robust in the face of errors.

SUMMARY OF THE INVENTION

One aspect of the technology is a method of reading nonvolatile memory. In response to a nonvolatile memory integrated circuit receiving a read command, the nonvolatile memory integrated circuit performs the following:

generating a first check code based on accessing nonvolatile data bits stored on the nonvolatile memory integrated circuit. In various embodiments, the first check code is an error detecting code or error correcting code.

accessing a second check code stored on the nonvolatile memory integrated circuit as nonvolatile check bits associated with the data bits. In an exemplary embodiment, this second check code was generated and programmed to the nonvolatile memory integrated circuit at the time of programming the associated data bits to the nonvolatile memory integrated circuit. In various embodiments, the second check code is an error detecting code or error correcting code.

checking whether the first check code and the second check code are in agreement.

after generating and accessing, responsive to disagreement between the first check code and the second check code, changing at least one reference applied to accesses of nonvolatile bits stored on the nonvolatile memory integrated circuit to distinguish between logical levels represented by the nonvolatile bits. The reference is, for example, a reference current, such as one used by a sense amplifier to determine the logical level represented by a sensed current. In another example, the reference is a reference voltage representative of a nonvolatile memory threshold voltage lying between two threshold voltage ranges that each represents a different logical level. In one embodiment, at least one reference distinguishes between at least a first logical level and a second logical level of the logical levels, such that the first logical level is associated with threshold voltages having higher magnitudes than the second logical level, and at least one reference is changed to widen the range of threshold voltages associated with the first logical level and to narrow the range of threshold voltages associated with the second logical level. Similarly, in another embodiment, at least one reference is changed to narrow the range of threshold voltages associated with the first logical level and to widen the range of threshold voltages associated with the second logical level.

In some embodiments, the nonvolatile memory integrated circuit further performs:

after changing at least one reference, generating an updated first check code based on accessing the nonvolatile data bits stored on the nonvolatile memory integrated circuit using at least one reference.

In some embodiments, in addition to generating the updated first check code, the nonvolatile memory integrated circuit further performs:

checking whether the first check code and the second check code are in agreement.

In some embodiments, in addition to generating the updated first check code and checking whether the first check code and the second check code are in agreement, the nonvolatile memory integrated circuit further performs:

using at least one reference, accessing the second check code stored on the nonvolatile memory integrated circuit as nonvolatile check bits associated with the data bits In some embodiments, in addition to generating the updated first check code, accessing the second check code with the changed reference, and checking whether the first check code and the second check code are in agreement, the nonvolatile memory integrated circuit further performs:

responsive to another disagreement between the first check code and the second check code, changing at least one reference applied to accesses of nonvolatile bits stored on the nonvolatile memory integrated circuit to distinguish between logical levels represented by the nonvolatile bits.

In some embodiments, after changing at least one reference, the nonvolatile memory integrated circuit further performs:

until success results from subsequent checking whether the first check code and the second check code are in agreement, iteratively changing at least one reference applied to accesses of nonvolatile bits stored on the nonvolatile memory integrated circuit to distinguish between logical levels represented by the nonvolatile bits.

Another aspect of the technology is a nonvolatile memory integrated circuit. The nonvolatile memory integrated circuit has a nonvolatile memory array, and control circuitry coupled to the nonvolatile memory array. The control circuitry is responsive to the nonvolatile memory integrated circuit receiving a read command, by performing actions as disclosed herein.

generating a first check code based on accessing a plurality of nonvolatile data bits stored on the nonvolatile memory integrated array;

accessing a second check code stored on the nonvolatile memory array as a plurality of nonvolatile check bits associated with the plurality of data bits;

checking whether the first check code and the second check code are in agreement;

after said generating and said accessing, responsive to disagreement between the first check code and the second check code, changing at least one reference applied to accesses of nonvolatile bits stored on the nonvolatile memory array to distinguish between logical levels represented by the nonvolatile bits.

DETAILED DESCRIPTION

Figure 1:
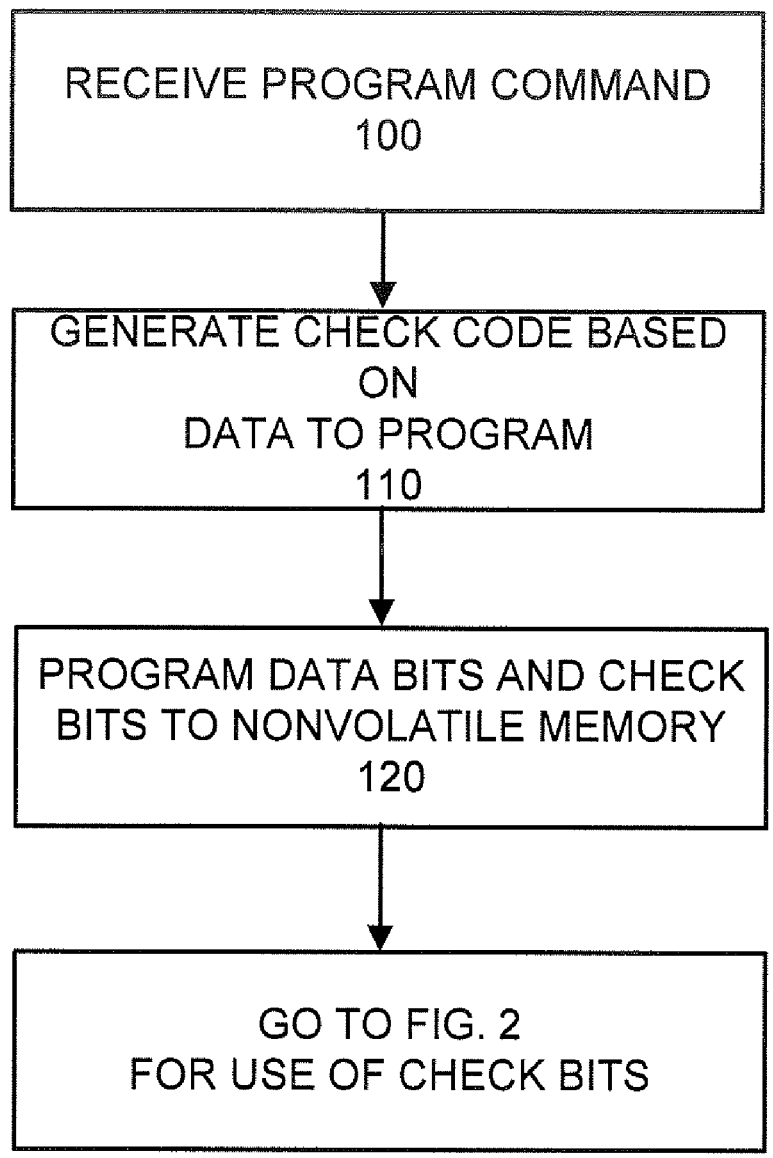
FIG. 1 is an exemplary flow chart of a program command, showing programming of data as well as a check code based on the data.

FIG. 1 is an exemplary flow chart of a program command, showing programming of data as well as a check code based on the data.

In 100, the nonvolatile memory integrated circuit receives a program command. In 110, a check code is generated based on data to be programmed by the program command. In various embodiments, the check code is an error correction code or error correction code. Examples of such codes are block codes (Hamming, Reed-Solomon, Reed-Muller, Goppa, Bose-Chaudhury-Hocquenhem, low density parity check), convolutional codes (turbo, Galileo), concatenated code, and interleaved codes. Other examples are single-error-correction double-error-detection codes, single-error-correction double-error-detection single-byte-error codes, single-byte-error-correction double-byte-error-detection, and double-error-correction triple-error-detection. The ability of various embodiments to detect or correct errors is partly dependent on the code algorithm of the particular embodiment.

In 120, both the program bits and the check code bite generated in 110 are programmed to the nonvolatile memory integrated circuit. The check code written in 120 is used in a read command, as shown in FIG. 2.

Figure 2:
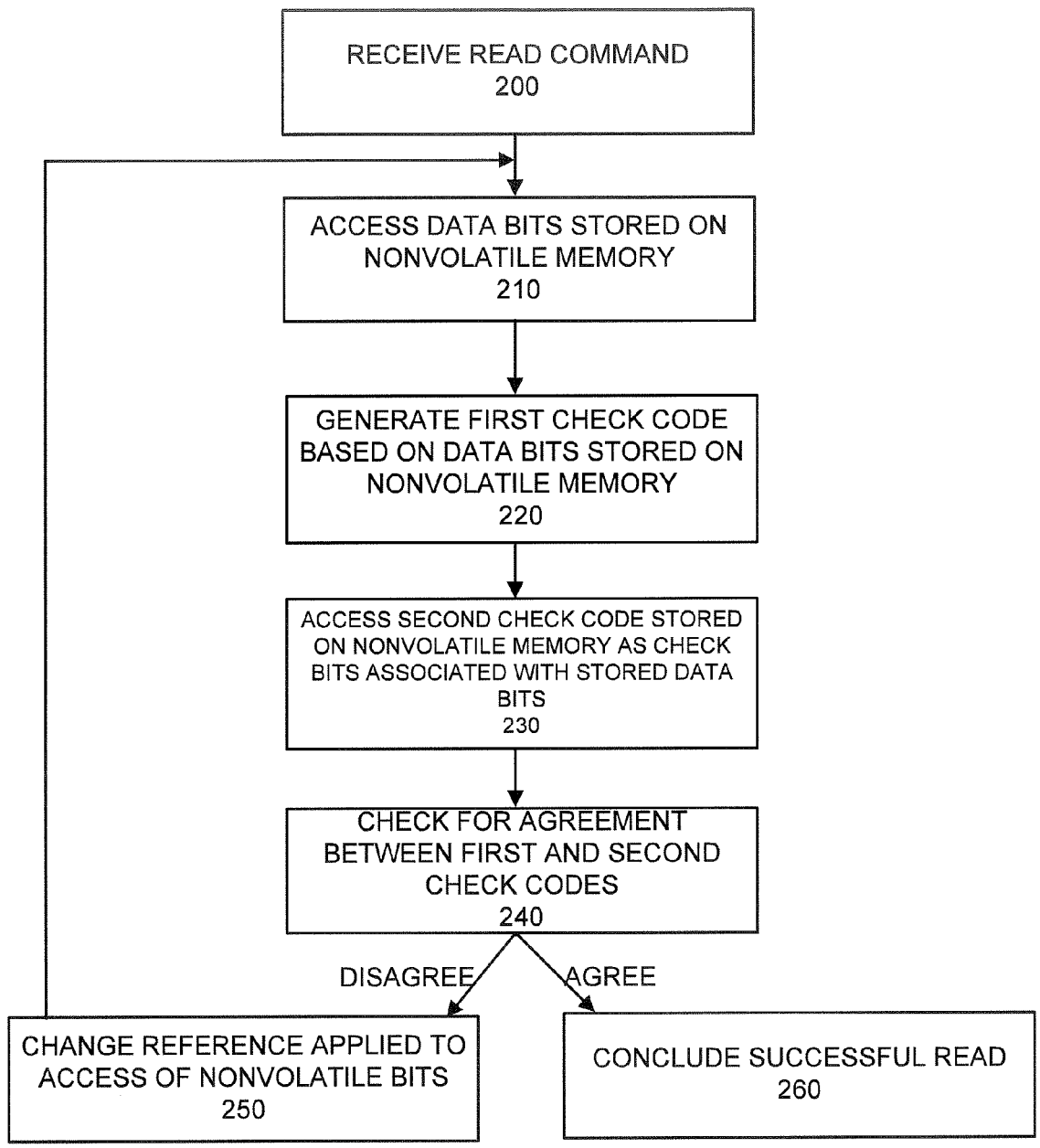
FIG. 2 is an exemplary flow chart of a read command, showing that a read reference is changed in response to a disagreement between a previously generated and programmed check code, and a new check code.

FIG. 2 is an exemplary flow chart of a read command, showing that a read reference is changed in response to a disagreement between a previously generated and programmed check code, and a new check code.

In 200, the nonvolatile memory integrated circuit receives a read command. In 210, the data bits programmed to the nonvolatile memory integrated circuit during 120 of FIG. 1 are accessed, using a reference to determine the logical levels represented by these data bits. In 220, a first check code is generated, based on the data bits that are accessed during 210. In 230, a second check code is accessed. The second check code is associated with the data bits read accessed in 210. The second check code was programmed to the nonvolatile memory integrated circuit in 120 of FIG. 1.

In 240, agreement is checked, between the first check code generated in 220 and the second code accessed in 230. If the first check code and second check code agree, then in 260 a successful read is concluded. However, if the first check code and second check code disagree, then the reference used in 210 is changed, and the flow chart loops back to 210. In response to continued errors, the loop may repeat as many as 3 to 10 times. If the reference is a reference current used by a sense amplifier to compare against a bit line current from a memory cell, then the reference current is changed, such as by changing the gate voltage of the reference cell or changing the timing of the sense amplifier circuitry. An exemplary magnitude of current change in the reference current is about 1 uA. In various embodiments, the changed reference may be used or not be used in accessing the second check code.

The flow charts of FIGS. 1 and 2 are exemplary. In other embodiments, the steps shown are rearranged, modified, deleted, or added to. For example, the steps of accessing data bits and accessing the second check code may be combined in a single step.

Figure 3:
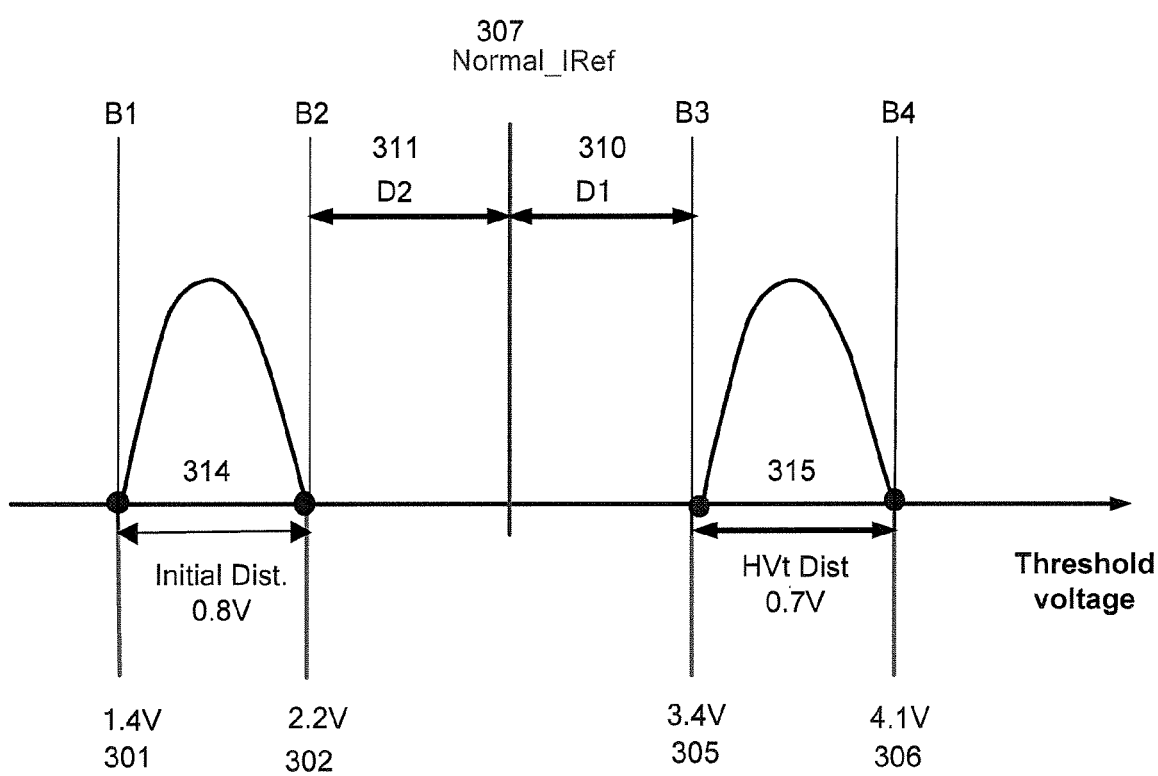
FIG. 3 shows an exemplary threshold voltage algorithm.

FIG. 3 shows an exemplary threshold voltage algorithm.

301 is the low bound of the low threshold voltage distribution B1. 302 is the high bound of the low threshold voltage distribution B2. 305 is the low bound of the high threshold voltage distribution B3. 306 is the high bound of the high threshold voltage distribution B4. A sense amplifier will sense the memory data by using a normal_Iref 307 and have a margin D1 310 for charge loss of high threshold voltage cells and margin D2 311 for charge gain of low threshold voltage cells. Although only two logical levels are shown, other embodiments have four or more logical levels to represent two or more bits.

Figure 4:
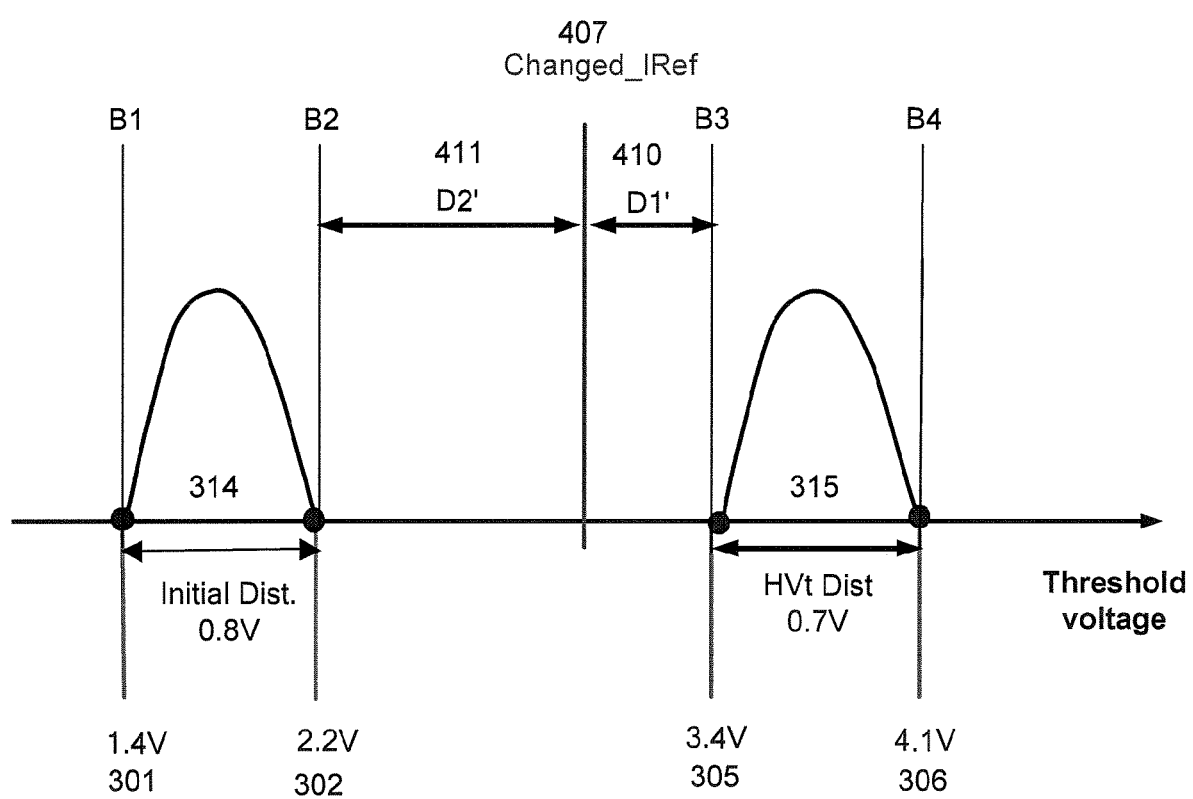
FIG. 4 shows an exemplary threshold voltage algorithm, similar to FIG. 3 but with a changed current reference, favoring a low threshold voltage distribution in contrast with FIG. 3.

FIG. 4 shows an exemplary threshold voltage algorithm, similar to FIG. 3 but with a changed current reference, favoring a low threshold voltage distribution in contrast with FIG. 3.

The changed current reference Changed_Iref 407 was changed in response to a disagreement between check codes, such as in 240 of FIG. 2. Changed_IRef 407 has a narrower sensing margin D1' 410 compared to D1 310 and a wider sensing margin D2' 411 compared to D2 311, so Changed_IRef 407 has a smaller sensing window for high threshold voltage cells and a larger sensing window for low threshold voltage cells. In the event of excess net negative charge gain by the charge storage material of the nonvolatile memory cells, the threshold voltage will be incorrectly raised. Therefore, Changed_IRef 407 will be more likely to result in a correct determination of the represented logical level.

Figure 5:
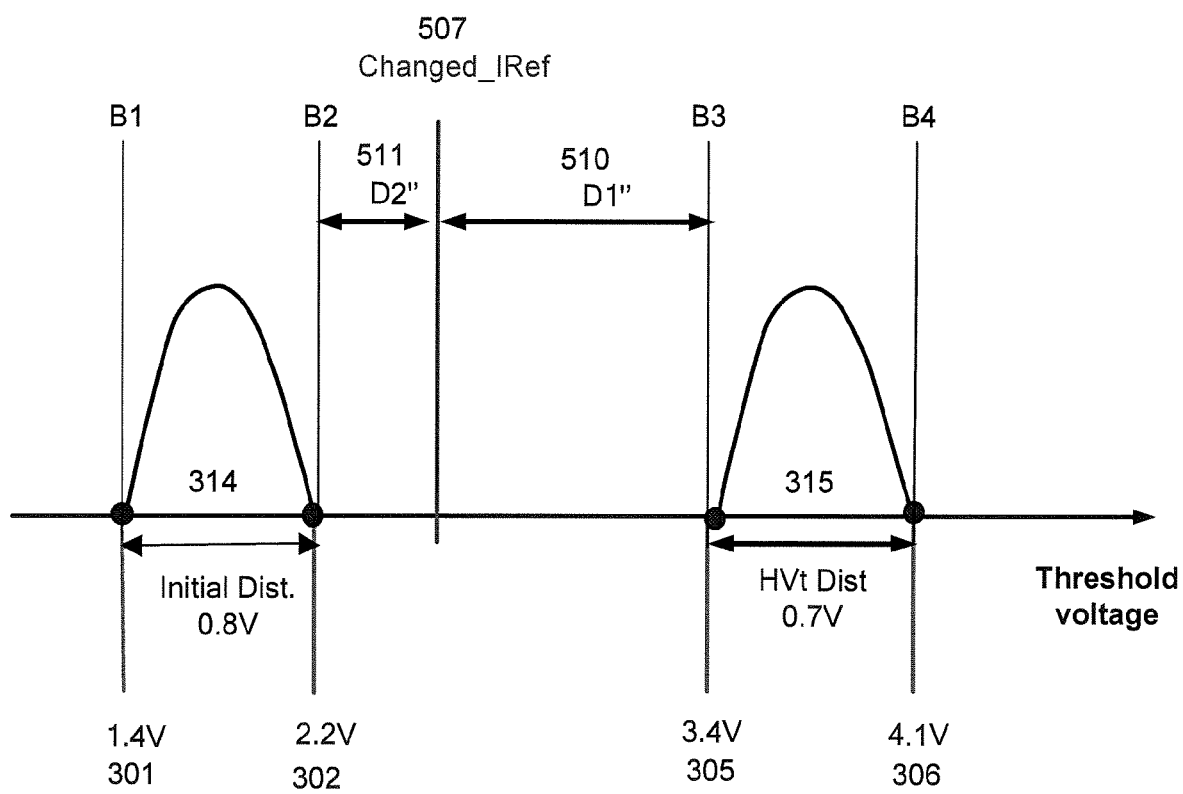
FIG. 5 shows an exemplary threshold voltage algorithm, similar to FIG. 3 but with another changed current reference, favoring a high threshold voltage distribution in contrast with FIG. 3.

FIG. 5 shows an exemplary threshold voltage algorithm, similar to FIG. 3 but with another changed current reference, favoring a high threshold voltage distribution in contrast with FIG. 3.

Similar but opposite to FIG. 4, Changed_IRef 507 has a wider sensing margin D1" 510 compared to D1 310 and a narrower sensing margin D2" 511 compared to D2 311, so Changed_IRef has a smaller sensing window for low threshold voltage cells and a larger sensing window for high threshold voltage cells. In the event of excess net positive charge gain by the charge storage material of the nonvolatile memory cells, the threshold voltage will be incorrectly lowered.

Therefore, Changed_IRef 507 will be more likely to result in a correct determination of the represented logical level.

In another embodiment, net positive charge gain results in changing the reference to favor the lower threshold voltage cells, and net negative charge gain results in changing the reference to favor the higher threshold voltage cells.

Figure 6:
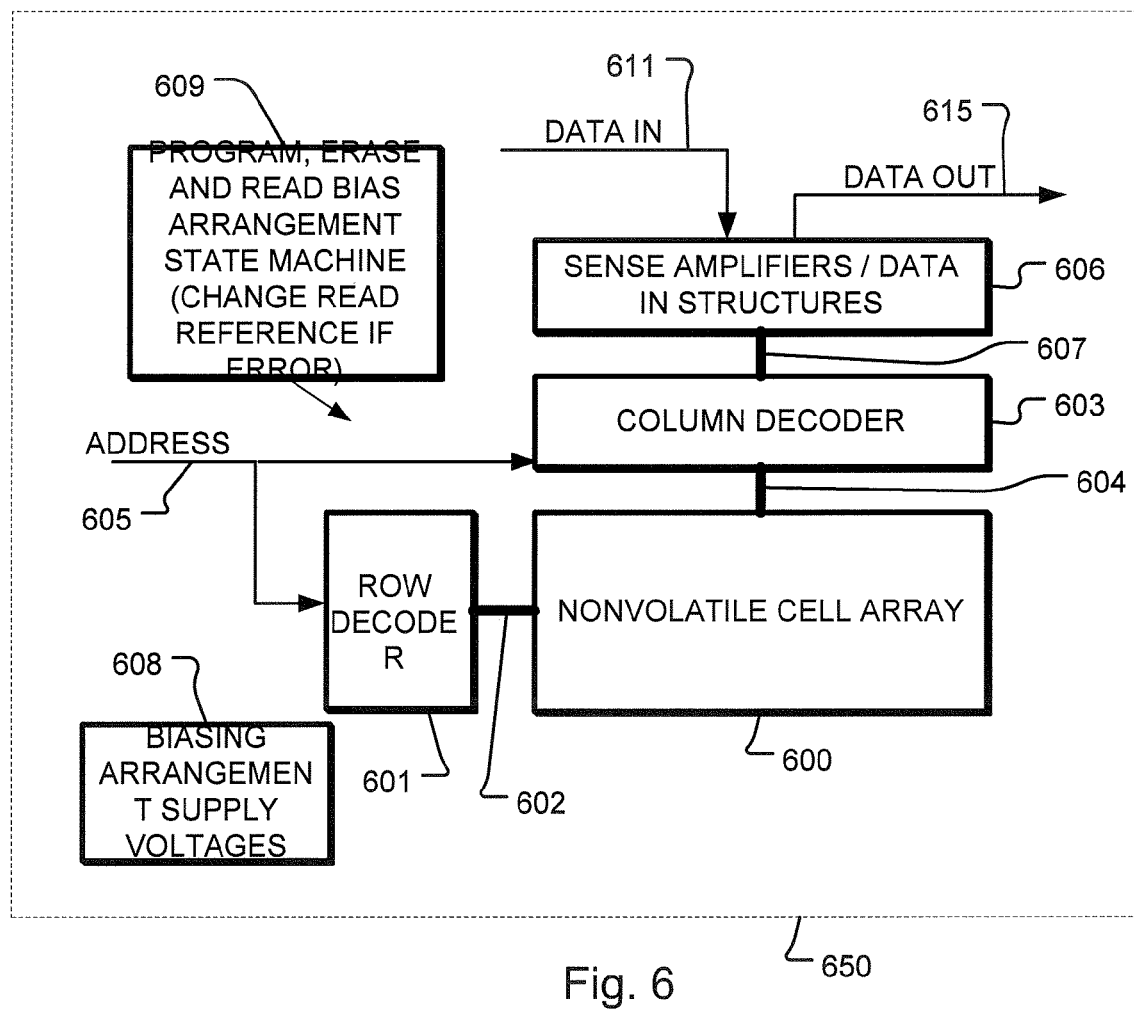
FIG. 6 shows an exemplary block diagram of a nonvolatile memory integrated circuit that changes the read reference in response to an error, such as disagreement between check codes as disclosed herein.

FIG. 6 shows an exemplary block diagram of a nonvolatile memory integrated circuit that changes the read reference in response to an error, such as disagreement between check codes as disclosed herein.

The integrated circuit 650 includes a memory array 600 of nonvolatile memory cells, on a semiconductor substrate. The memory cells of array 600 may be individual cells, interconnected in arrays, or interconnected in multiple arrays. A row decoder 601 is coupled to a plurality of word lines 602 arranged along rows in the memory array 600. A column decoder 603 is coupled to a plurality of bit lines 604 arranged along columns in the memory array 600. Addresses are supplied on bus 605 to column decoder 603 and row decoder 601. Sense amplifier and data-in structures 606 are coupled to the column decoder 603 via data bus 607. Data is supplied via the data-in line 611 from input/output ports on the integrated circuit 650, or from other data sources internal or external to the integrated circuit 650, to the data-in structures in block 606. Data is supplied via the data-out line 615 from the sense amplifiers in block 606 to input/output ports on the integrated circuit 650, or to other data destinations internal or external to the integrated circuit 650. A bias arrangement state machine 609 controls the application of bias arrangement supply voltages 608, such as for the erase verify and program verify voltages, and the arrangements for programming, erasing, and reading the memory cells. The bias arrangement state machine 609 causes the reference used by the sense amplifiers of block 606 to change in response to an error in comparison between check codes, as disclosed herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of reading nonvolatile memory, comprising:
   in response to a nonvolatile memory integrated circuit receiving a read command, the nonvolatile memory integrated circuit performing:
      generating a first check code based on accessing a plurality of nonvolatile data bits stored on the nonvolatile memory integrated circuit;
      accessing a second check code stored on the nonvolatile memory integrated circuit as a plurality of nonvolatile check bits associated with the plurality of data bits;
      checking whether the first check code and the second check code are in agreement;
      after said generating and said accessing, responsive to disagreement between the first check code and the second check code, changing at least one reference applied to accesses of nonvolatile bits stored on the nonvolatile memory integrated circuit to distinguish between logical levels represented by the nonvolatile bits.

2. The method of claim 1, wherein said at least one reference is a reference current.

3. The method of claim 1, wherein said at least one reference is a reference voltage.

4. The method of claim 1, wherein the first check code and the second check code are error correcting codes.

5. The method of claim 1, wherein the first check code and the second check code are error detecting codes.

6. The method of claim 1, the nonvolatile memory integrated circuit further performing:
   after said changing at least one reference, generating an updated first check code based on accessing the plurality of nonvolatile data bits stored on the nonvolatile memory integrated circuit using said at least one reference.

7. The method of claim 1, the nonvolatile memory integrated circuit further performing:
   after said changing at least one reference, performing:
      using said at least one reference, generating the first check code based on accessing the plurality of nonvolatile data bits stored on the nonvolatile memory integrated circuit; and
      checking whether the first check code and the second check code are in agreement.

8. The method of claim 1, the nonvolatile memory integrated circuit further performing:
   after said changing at least one reference, performing:
      using said at least one reference, generating the first check code based on accessing the plurality of nonvolatile data bits stored on the nonvolatile memory integrated circuit;
      using said at least one reference, accessing the second check code stored on the nonvolatile memory integrated circuit as the plurality of nonvolatile check bits associated with the plurality of data bits; and
      checking whether the first check code and the second check code are in agreement.

9. The method of claim 1, the nonvolatile memory integrated circuit further performing:
   after said changing at least one reference, performing:
      using said at least one reference, generating the first check code based on accessing the plurality of nonvolatile data bits stored on the nonvolatile memory integrated circuit;
      using said at least one reference, accessing the second check code stored on the nonvolatile memory integrated circuit as the plurality of nonvolatile check bits associated with the plurality of data bits;
      checking whether the first check code and the second check code are in agreement; and
      responsive to another disagreement between the first check code and the second check code, changing said at least one reference applied to accesses of nonvolatile bits stored on the nonvolatile memory integrated circuit to distinguish between logical levels represented by the nonvolatile bits.

10. The method of claim 1, the nonvolatile memory integrated circuit further performing:
    after said changing at least one reference, performing:
       until success results from subsequent checking whether the first check code and the second check code are in agreement, iteratively changing said at least one reference applied to accesses of nonvolatile bits stored on the nonvolatile memory integrated circuit to distinguish between logical levels represented by the nonvolatile bits.

11. The method of claim 1, wherein said at least one reference distinguishes between at least a first logical level and a second logical level of said logical levels, the first logical level is associated with threshold voltages having higher magnitudes than the second logical level, and said changing at least one reference comprises:

changing at least one reference such that a first range of threshold voltages associated with the first logical level widens and a second range of threshold voltages associated with the second logical level narrows.

12. The method of claim 11, wherein said at least one reference distinguishes between at least a first logical level and a second logical level of said logical levels, the first logical level is associated with threshold voltages having higher magnitudes than the second logical level, and said changing at least one reference comprises:

changing at least one reference such that a first range of threshold voltages associated with the first logical level narrows and a second range of threshold voltages associated with the second logical level widens.

13. A nonvolatile memory integrated circuit, comprising:

a nonvolatile memory array; and control circuitry coupled to the nonvolatile memory array, the control circuitry responsive to the nonvolatile memory integrated circuit receiving a read command by performing:

generating a first check code based on accessing a plurality of nonvolatile data bits stored on the nonvolatile memory integrated array;

accessing a second check code stored on the nonvolatile memory array as a plurality of nonvolatile check bits associated with the plurality of data bits;

checking whether the first check code and the second check code are in agreement;

after said generating and said accessing, responsive to disagreement between the first check code and the second check code, changing at least one reference applied to accesses of nonvolatile bits stored on the nonvolatile memory array to distinguish between logical levels represented by the nonvolatile bits.

14. The integrated circuit of claim 13, wherein said at least one reference is a reference current.

15. The integrated circuit of claim 13, wherein said at least one reference is a reference voltage.

16. The integrated circuit of claim 13, wherein the first check code and the second check code are error correcting codes.

17. The integrated circuit of claim 13, wherein the first check code and the second check code are error detecting codes.

18. The integrated circuit of claim 13, the control circuitry responsive to the nonvolatile memory integrated circuit receiving the read command by further performing:

after said changing at least one reference, generating an updated first check code based on accessing the plurality of nonvolatile data bits stored on the nonvolatile memory array using said at least one reference.

19. The integrated circuit of claim 13, the control circuitry responsive to the nonvolatile memory integrated circuit receiving the read command by further performing:

after said changing at least one reference, performing:

using said at least one reference, generating the first check code based on accessing the plurality of nonvolatile data bits stored on the nonvolatile memory array; and checking whether the first check code and the second check code are in agreement.

20. The integrated circuit of claim 13, the control circuitry responsive to the nonvolatile memory integrated circuit receiving the read command by further performing:

after said changing at least one reference, performing:

using said at least one reference, generating the first check code based on accessing the plurality of nonvolatile data bits stored on the nonvolatile memory array;

using said at least one reference, accessing the second check code stored on the nonvolatile memory array as the plurality of nonvolatile check bits associated with the plurality of data bits; and checking whether the first check code and the second check code are in agreement.

21. The integrated circuit of claim 13, the control circuitry responsive to the nonvolatile memory integrated circuit receiving the read command by further performing:

after said changing at least one reference, performing:

using said at least one reference, generating the first check code based on accessing the plurality of nonvolatile data bits stored on the nonvolatile memory array;

using said at least one reference, accessing the second check code stored on the nonvolatile memory array as the plurality of nonvolatile check bits associated with the plurality of data bits;

checking whether the first check code and the second check code are in agreement; and responsive to another disagreement between the first check code and the second check code, changing said at least one reference applied to accesses of nonvolatile bits stored on the nonvolatile memory array to distinguish between logical levels represented by the nonvolatile bits.

22. The integrated circuit of claim 13, the control circuitry responsive to the nonvolatile memory integrated circuit receiving the read command by further performing:

after said changing at least one reference, performing:

until success results from subsequent checking whether the first check code and the second check code are in agreement, iteratively changing said at least one reference applied to accesses of nonvolatile bits stored on the nonvolatile memory integrated circuit to distinguish between logical levels represented by the nonvolatile bits.

23. The integrated circuit of claim 13, wherein said at least one reference distinguishes between at least a first logical level and a second logical level of said logical levels, the first logical level is associated with threshold voltages having higher magnitudes than the second logical level, and said changing at least one reference by said control circuitry comprises:

changing at least one reference such that a first range of threshold voltages associated with the first logical level widens and a second range of threshold voltages associated with the second logical level narrows.

24. The integrated circuit of claim 13, wherein said at least one reference distinguishes between at least a first logical level and a second logical level of said logical levels, the first logical level is associated with threshold voltages having higher magnitudes than the second logical level, and said changing at least one reference by said control circuitry comprises:

changing at least one reference such that a first range of threshold voltages associated with the first logical level narrows and a second range of threshold voltages associated with the second logical level widens.

25. A nonvolatile memory integrated circuit, comprising:
a nonvolatile memory array means; and
control circuitry means coupled to the nonvolatile memory array means, the control circuitry means responsive to the nonvolatile memory integrated circuit receiving a read command, comprising:
- means for generating a first check code based on accessing a plurality of nonvolatile data bits stored on the nonvolatile memory integrated array;
- means for accessing a second check code stored on the nonvolatile memory array as a plurality of nonvolatile check bits associated with the plurality of data bits;
- means for checking whether the first check code and the second check code are in agreement;
- means responsive to disagreement between the first check code and the second check code, for changing at least one reference applied to accesses of nonvolatile bits stored on the nonvolatile memory array to distinguish between logical levels represented by the nonvolatile bits.

* * * * *